(12) United States Patent
Huang

(10) Patent No.: US 10,595,404 B2
(45) Date of Patent: Mar. 17, 2020

(54) HOT-PRESS PROTECTION RELEASE COLLOID AND USES OF THE SAME

(71) Applicant: TECH ADVANCE INDUSTRIAL CO., LTD., New Taipei (TW)

(72) Inventor: Chun-Chih Huang, New Taipei (TW)

(73) Assignee: TECH ADVANCE INDUSTRIAL CO., LTD., New Taipei (TW)

( * ) Notice: Subject to any disclaimer, the term of this patent is extended or adjusted under 35 U.S.C. 154(b) by 244 days.

(21) Appl. No.: 15/606,911

(22) Filed: May 26, 2017

(65) Prior Publication Data

US 2018/0250705 A1 Sep. 6, 2018

(30) Foreign Application Priority Data

Mar. 3, 2017 (TW) .............................. 106107007 A

(51) Int. Cl.

| | |
|---|---|
| *H05K 1/03* | (2006.01) |
| *H05K 3/28* | (2006.01) |
| *C08J 5/18* | (2006.01) |
| *C08J 7/04* | (2020.01) |
| *B05D 3/02* | (2006.01) |
| *C08G 18/62* | (2006.01) |
| *C08G 18/10* | (2006.01) |

(52) U.S. Cl.
CPC .............. *H05K 1/0353* (2013.01); *C08J 5/18* (2013.01); *C08J 7/047* (2013.01); *C08J 2375/04* (2013.01)

(58) Field of Classification Search
USPC ........................................ 524/507; 427/96.5
See application file for complete search history.

(56) References Cited

U.S. PATENT DOCUMENTS 7,291,372 B2 * 11/2007 Otsuki ................... C09J 133/04
428/40.1

FOREIGN PATENT DOCUMENTS

| JP | 2010-116532 A | * | 5/2010 | ................ C08J 5/18 |
|---|---|---|---|---|
| KR | 2009-0006249 A | | 1/2009 | |
| TW | 200517022 A | | 5/2005 | |
| TW | 200951197 A | | 12/2009 | |

OTHER PUBLICATIONS

Online translation of Detailed Description of JP 2010-116532 A; published: May 2010 (Year: 2010).*
Technical Data Sheet: WANNATE HT-75B, Wanhua Chemical Group, Ltd., 2 pages (Revised: Aug. 20, 2014, Version: 2.1) (Year: 2014).*
Taiwanese Office Action from corresponding Taiwanese Patent Application No. 106107007, dated Sep. 27, 2017.
Abstract of TW 201704421A, published Feb. 1, 2017, Applicant: Fujimori Kogyo Co., Ltd. (Abstract Only).
Taiwanese Office Action from corresponding Taiwanese Patent Application No. 106107007, dated Apr. 18, 2018.

* cited by examiner

*Primary Examiner* — Fred M Teskin
(74) *Attorney, Agent, or Firm* — Greer, Burns & Crain, Ltd.

(57) ABSTRACT

A hot-press protection release colloid for applying on a surface of an object to be hot-pressed is provided. The hot-press protection release colloid includes an acrylate-based resin, a polymeric isocyanate component, and a solvent, wherein the amount of the polymeric isocyanate component is 1 to 30 parts by weight per 100 parts by weight of the acrylate-based resin, and wherein the hot-press protection has a viscosity of 10,000 to 500,000 cP.

6 Claims, 1 Drawing Sheet

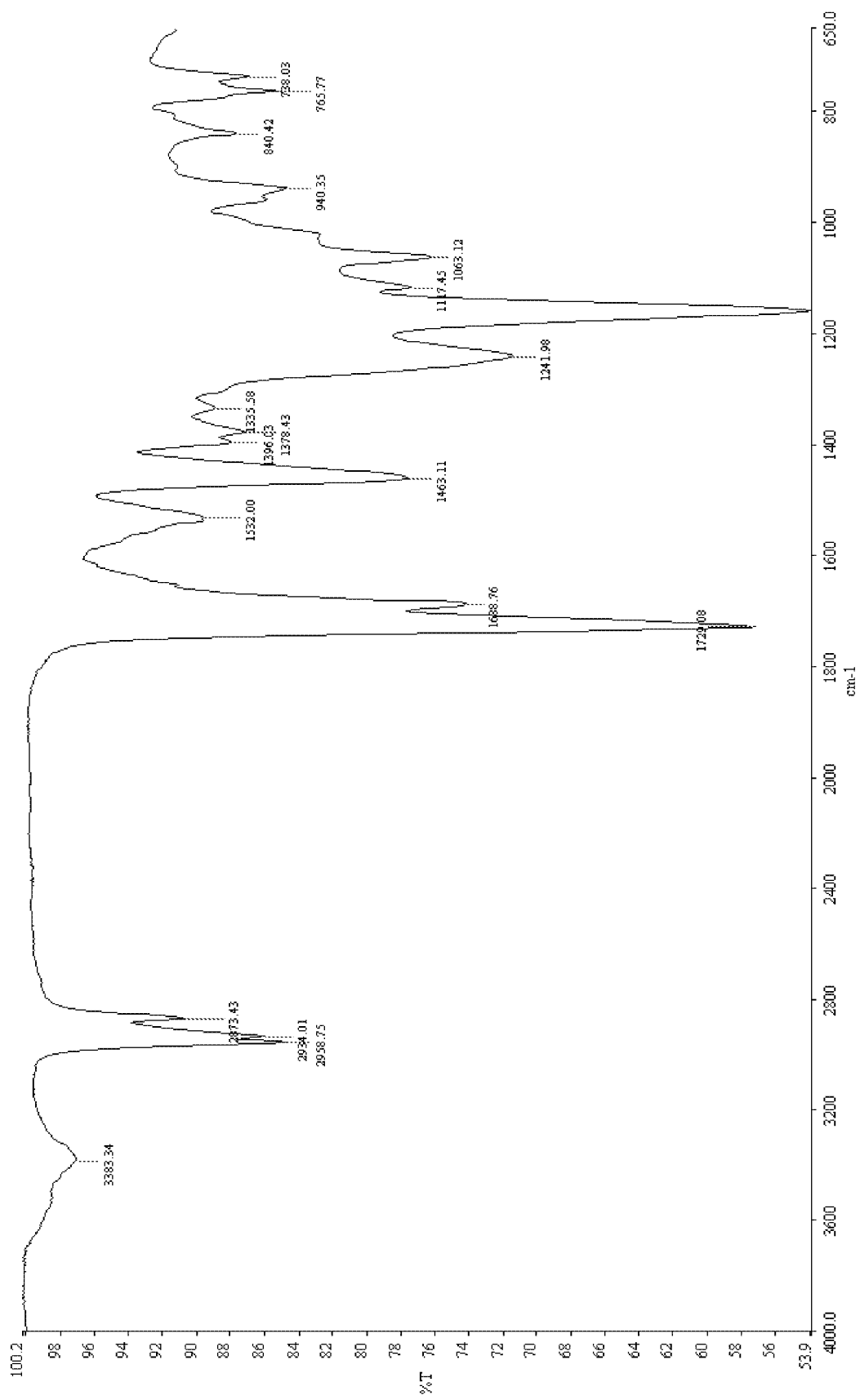

HOT-PRESS PROTECTION RELEASE COLLOID AND USES OF THE SAME

CLAIM FOR PRIORITY

This application claims the benefit of Taiwan Patent Application No. 106107007 filed on Mar. 3, 2017, the subject matters of which are incorporated herein in their entirety by reference.

BACKGROUND

Field of the Invention

The present invention relates to a hot-press protection release colloid, especially a hot-press protection release colloid that uses an acrylate-based resin and a polymeric isocyanate component at a specific ratio, and a hot-press protection release film formed by using the hot-press protection release colloid. The present invention also relates to uses of the hot-press protection release colloid and the hot-press protection release film in hot-press processes.

Descriptions of the Related Art

Electronic devices have complex structures and have been able to perform many functions. As a result, the distance between the contacts of circuit elements is short, the number of junctions is large, and the length of connecting wires between the contacts is short. The manufacturing of such electronic devices must be carried out by using high-density wiring arrangements and micro via-hole technology. Furthermore, such electronic device requires a multilayer printed circuit board because it is difficult to realize the required wiring and bridging arrangement on a single-side or double-side board.

Generally, a multilayer or build-up printed circuit board, or a high-density printed circuit board (HDI PCB), can be prepared by using build-up technology. With the aforementioned technology, a prepreg (or an insulating layer) is provided, a copper foil is deposited thereon, and the copper foil is patterned before or after the hot-press process to form a circuit. Then, another prepreg is deposited on the patterned copper foil, followed by copper depositing and patterning. By repeating this procedure several times, a multilayer or build-up printed circuit board is obtained. However, during the preparation, every circuit layer must be hindered for protection, otherwise the circuit layer will be corroded by the etchant during the preparation of another circuit layer.

The desired protection is generally provided by using a sacrificial protection layer as a step or processing functional film. For example, Taiwan Patent Application Laid-open Publication No. 200517022 discloses a protection film hot-press manufacturing method of a printed circuit board, wherein a protection film is deposited on a circuit layer and shaped through the hot-press of a pressing machine to make the protection film more fitted to the surface of the circuit layer, so that the flow of adhesive and the deformation of the circuit layer can be avoided during the subsequent hot-press process. However, the aforementioned method is only suitable for some specific structures, and there are many limitations for the protection film.

Similar problems can also occur in the chip packaging process. For example, it is necessary to use a protection release film to protect the chip during the hot-press packaging procedure in the following packaging processes: Wafer Level Packaging, Integrated Fan-out (InFO) Packaging, Coreless Packaging, Lead Frame Packaging, and Bonding Sheet Packaging. A protection release film suitable for chip packaging process must have a heat resistance that is sufficient to bear the hot-press formation procedure, and the protection release film must be able to be completely removed without residue after packaging. The protection release film cannot generate a harmful gas pollution during the hot-press procedure. Furthermore, it is preferred if the protection release film could eliminate step-difference, prevent via holes from being blocked by adhesive, planarize the hot-pressed surface, and minimize the residue generated due to the hot-press formation procedure.

One type of protection release films uses silica resin as the main component of the colloid layer of protection release film. Such protection release film has the problems of silicone oil precipitation after a hot-press procedure. The precipitated silicone oil is disadvantageous to the formation of the circuit. Another type of protection release films uses Teflon (polytetrafluoroethylene), but Teflon only provides release function and is unfriendly to the environment and therefore unsuitable for Green Factory. Yet another type of protection release films is a UV light-cured protection release film, which is further polymerized by UV light after being superimposed on an object to be hot-pressed to improve the stripping performance. However, the use of UV light-cured protection release film makes the process more complex, and UV light could damage the boards or chips. Furthermore, the application of UV light-cured protection release film is limited because the heat resistance of such protection release film is poor.

In view of the above, there is still a need for a hot-press protection release film which has fewer limitations and can satisfy the needs of various objects to be hot-pressed (e.g., boards, chips, electrical conducting circuits, and the like).

SUMMARY

An objective of the present invention is to provide a hot-press protection release colloid for applying on a surface of an object to be hot-pressed, wherein the hot-press protection release colloid has a viscosity of 10,000 to 500,000 cP and comprises an acrylate-based resin, a polymeric isocyanate component, and a solvent, and wherein the amount of the polymeric isocyanate component is 1 to 30 parts by weight per 100 parts by weight of the acrylate-based resin.

Another objective of the present invention is to provide a hot-press protection release film for applying on a surface of an object to be hot-pressed, wherein the hot-press protection release film comprises a hot-press protection release layer, and the hot-press protection release layer is formed by subjecting the hot-press protection release colloid described above to a heat-drying step and afterwards to the following aging steps: allowing the hot-press protection release colloid to stand under room temperature for 5 to 9 days or drying the hot-press protection release colloid under 40° C. to 60° C. for 4 to 8 hours, and then drying the hot-press protection release colloid under 80° C. to 150° C. for 5 to 30 hours.

Yet another objective of the present invention is to provide a hot-press method, comprising the following steps in sequence:
applying the hot-press protection release colloid or hot-press protection release film described above on a surface of an object to be hot-pressed; and
hot-pressing the object to be hot-pressed under a selected temperature and pressure.

Yet another objective of the present invention is to provide a method for manufacturing a hot-press protection release film, wherein the hot-press protection release film comprises a hot-press protection release layer. The method comprises the following:

subjecting the hot-press protection release colloid described above to a heat-drying step and afterwards to the following aging step to form the hot-press protection release layer: allowing the hot-press protection release colloid to stand under room temperature for 5 to 9 days or drying the hot-press protection release colloid under 40° C. to 60° C. for 4 to 8 hours, and then drying the hot-press protection release colloid under 80° C. to 150° C. for 5 to 30 hours.

To render the above objectives, the technical features and advantages of the present invention more apparent, the present invention will be described in detail with reference to some embodiments hereinafter.

BRIEF DESCRIPTION OF THE DRAWINGS

FIGURE is a Fourier transform infrared spectroscopy (FTIR) infrared spectrum of one embodiment of the present hot-press protection release film.

DETAILED DESCRIPTION

Hereinafter, some embodiments of the present invention will be described in detail. However, without departing from the spirit of the present invention, the present invention may be embodied in various embodiments and should not be limited to the embodiments described in the specification. Furthermore, for clarity, the size of each element and each area may be exaggerated in the appended drawings and not depicted in actual proportion. Unless it is additionally explained, the expressions "a," "the," or the like recited in the specification (especially in the claims) should include both the singular and the plural forms.

The technical effects to be achieved by the present invention lie in that the hot-press protection release colloid or the hot-press protection release film is superior in release performance (i.e., there is substantially no residual colloid remained on the surface of an object to be hot-pressed after release), and the hot-press protection release layer of the hot-press protection release film has a flat surface without irregular bumps. In view of this, the present invention employs the following technical means: acrylate-based resins are used in combination with polymeric isocyanate components at a specific ratio and mixed under specific process conditions. The hot-press protection release colloid of the present invention and the layer formed by drying and aging the hot-press protection release colloid may be applied in many hot-press processes, such as multi-boards packaging, lead frame packaging, die bonding packaging, flip chip packaging, and IC packaging. The hot-press protection release colloid of the present invention and the layer formed by drying and aging the hot-press protection release colloid are advantageous to the injecting adhesive packaging and capable of eliminating step-difference, filling via holes and blocking adhesive. The hot-press protection release colloid of the present invention and the layer formed by drying and aging the hot-press protection release colloid can be easily released without residual colloid. Hereinafter, further detailed descriptions are provided for the present invention.

Hot-Press Protection Release Colloid

The hot-press protection release colloid of the present invention can be applied on a surface of an object to be hot-pressed. The hot-press protection release colloid comprises an acrylate-based resin, a polymeric isocyanate component, and a solvent, wherein the amount of the polymeric isocyanate component is 1 to 30 parts by weight per 100 parts by weight of the acrylate-based resin, and wherein the hot-press protection colloid has a viscosity of 10,000 to 500,000 cP. To make the hot-press protection release colloid of the present invention achieve the aforementioned viscosity, the hot-press protection release colloid may be formed by the following methods. The essential components of the hot-press protection release colloid, including the acrylate-based resin, the polymeric isocyanate component, and the solvent, and other optional components (such as the common components used in release colloid as described below) are mixed under 20° C. to 50° C. by a stirrer to form a mixture and then stirred for 1 to 4 hours. During the stirring, some of the solvent is removed and the polymerization reaction is performed. After the stirring, the hot-press protection release colloid with the desired viscosity can be obtained. However, the preparation method of the hot-press protection release colloid of the present invention is not limited thereto, and users may adjust the preparation method or choose other method depending on needs. Therefore, the aforementioned stirring may also be performed at a temperature higher than 50° C., and the duration of stirring may also exceed 4 hours, as long as the hot-press protection release colloid has the desired viscosity and can meet the requirements of the hot-press process. Furthermore, the desired temperature during the heat-stirring may be achieved by any possible means. For example, the desired temperature may be achieved by supplying thermal energy (such as a water bath, an oil bath, an electric heater, or a heat exchanger), radiant energy (such as ultraviolet irradiation or gamma irradiation), or a combination thereof, to the mixture.

The hot-press protection release colloid of the present invention may be directly applied onto the surface of the object to be hot-pressed by common coating methods in the art. The common coating methods include but are not limited to knife coating, roller coating, bar coating, slot die coating, gravure coating, spin coating, and spray coating. The hot-press protection release colloid of the present invention when applied onto the surface of the object to be hot-pressed forms a sacrificial protection layer, which provides a protective function during the hot-press process and forms a film that can be removed easily after the hot-press process.

Generally, in the case of using an isocyanate component as a cross-linking agent in a colloid which uses acrylate-based resin as the main component, the isocyanate component is used in an extremely small amount, such as about 0.1 parts by weight per 100 parts by weight of acrylate-based resin to prevent affecting the physicochemical properties of the final product. However, in the hot-press protection release colloid of the present invention, the polymeric isocyanate component is used at a relatively high ratio, which surprisingly improves the cross-linkage of the acrylate-based resin and the polymeric isocyanate component. In some embodiments of the present invention, based on 100 parts by weight of the acrylate-based resin, the amount of the polymeric isocyanate component is 1 to 30 parts by weight, preferably 5 to 25 parts by weight, and more preferably 10 to 20 parts by weight, such as 1.5 parts by weight, 2 parts by weight, 3 parts by weight, 4 parts by weight, 5 parts by weight, 7 parts by weight, 7.5 parts by weight, 9 parts by weight, 10 parts by weight, 11 parts by weight, 12 parts by weight, 12.5 parts by weight, 13 parts by weight, 15 parts by weight, 17.5 parts by weight, 18 parts by weight, 20 parts by weight, 22 parts by weight, 24 parts by weight, 25 parts by weight, 26 parts by weight, 27.5 parts by weight, or 29 parts by weight.

The acrylate-based resin refers to resins containing an acrylate-based compound or acrylate-based polymer. An acrylate is an ester derived from an acrylic acid, and an acrylic acid usually refers to an unsaturated carboxylic acid containing vinyl and carboxyl. For example, examples of the acrylate-based resin that can be used in the hot-press protection release colloid of the present invention include but are not limited to that selected from the group consisting of methyl acrylate resins, methyl methacrylate resins, ethyl acrylate resins, ethyl methacrylate resins, propyl acrylate resins, propyl methacrylate resins, butyl acrylate resins, butyl methacrylate resins, and combinations thereof. In some embodiments of the present invention, methyl acrylate resins or methyl methacrylate resins are used.

The molecular weight of the acrylate-based resin is not particularly limited, and can be selected depending on the needs of a person with ordinary skill in the art. For example, the molecular weight of the acrylate-based resin may be about 500,000 to 1,500,000, preferably about 800,000 to 1,200,000, and more preferably about 900,000 to 1,100,000, such as 900,000, 925,000, 950,000, 975,000, 1,000,000, 1,025,000, 1,050,000, or 1,075,000. In some embodiments of the present invention, the acrylate-based resin has a molecular weight of about 1,000,000 and a solid content of about 5% to 30%, preferably 15% to 25%.

The polymeric isocyanate component refers to a component which has an isocyanate group and can conduct a polymerization reaction with other components of the hot-press protection release colloid of the present invention. Examples of the polymeric isocyanate component suitable for the hot-press protection release colloid of the present invention include but are not limited to that selected from a group consisting of polymeric toluene diisocyanate (polymeric TDI), polymeric isophorone diisocyanate (polymeric IPDI), polymeric methylene diphenyl diisocyanate (polymeric MDI), polymeric hexamethylene diisocyanate (polymeric HMDI), and combinations thereof.

The molecular weight of the polymeric isocyanate component is not particularly limited and can be selected depending on the needs of a person with ordinary skill in the art. For example, the molecular weight of the polymeric isocyanate component may be about 5,000 to 50,000, preferably about 7,000 to 45,000, and more preferably about 8,000 to 40,000. In some embodiments of the present invention, the polymeric isocyanate component is a mixture of polymeric isocyanate and butyl acetate with a solid content of about 60% to 90%, and preferably about 75% to 85%, such as 75%, 78%, 80%, 82%, or 85%.

In the hot-press protection release colloid of the present invention, any solvent which dissolves (or disperses) but does not react with the acrylate-based resin and polymeric isocyanate component can be used. It is preferable to use a solvent capable of providing a catalysis effect. Furthermore, in view of operation convenience, the solvent preferably has a boiling point that is at least higher than the highest operation temperature involved during the preparation of the hot-press protection release colloid, so that the escape of the solvent during the preparation can be avoided or substantially avoided. The escape of the solvent will change the concentration of the reaction solution and then cause problems in subsequent processes, e.g., make the solution too viscous to stir, or affect the properties of the hot-press protection release colloid prepared thereby.

Examples of the solvent that can be used in the hot-press protection release colloid of the present invention include but are not limited to that selected from the group consisting of ethyl acetate (EAC), methyl ethyl ketone oxime (MEKO), methyl ethyl ketone (MEK), and combinations thereof. In some embodiments of the present invention, the solvent is ethyl acetate. Furthermore, the amount of the solvent is not particularly limited as long as the acrylate-based resin and polymeric isocyanate component can be evenly dissolved or dispersed therein. In terms of the final viscosity of the prepared hot-press protection release colloid, based on 100 parts by weight of the acrylate-based resin, the amount of the solvent is about 60 parts by weight to about 120 parts by weight, preferably about 75 parts by weight to about 110 parts by weight, and more preferably about 90 parts by weight to 105 parts by weight.

The hot-press protection release colloid of the present invention may optionally further comprise other components commonly used in a release colloid. Such components include but are not limited to that selected from the group consisting of antistatic agents, chelating agents, flame retardants (e.g., phosphorous-containing flame retardants or bromine-containing flame retardants), polymerization promoters, fillers, dispersing agents (e.g., silane coupling agents), flexibilizers, and combinations thereof. Those components may be used alone or in combination depending on needs. For example, polymerization promoters such as a Lewis acid or an imidazole can be used to control the length of hot-press process time and improve the hardening performance. Alternatively, a filler selected from the group consisting of silica, glass powder, and a combination thereof may be added to adjust the processability, flame retardance, thermal resistance, and moisture resistance of the hot-press protection release colloid. The amount of the aforementioned component commonly used in a release colloid is not particularly limited, and can be adjusted depending on the needs of a person with ordinary skill in the art. In some embodiments of the present invention, the hot-press protection release colloid further comprises an antistatic agent, or a chelating agent selected from the group consisting of platinum chelating agent, aluminum chelating agent, iron chelating agent, chrome chelating agent, nickel chelating agent, copper chelating agent, and combinations thereof Hot-Press Protection Release Film In consideration of different types of use, the hot-press protection release colloid of the present invention may be heat-dried and afterwards aged to form a hot-press protection release layer structure before being applied onto an object to be hot-pressed. Therefore, the present invention also provides a hot-press protection release film, which comprises a hot-press protection release layer. The hot-press protection release layer is formed by subjecting the hot-press protection release colloid of the present invention to a heat-drying step to remove most of the solvent and afterwards to the following aging steps: allowing the hot-press protection release colloid to stand under room temperature for 5 to 9 days or drying the hot-press protection release colloid under 40° C. to 60° C. for 4 to 8 hours, and then drying the hot-press protection release colloid under 80° C. to 150° C. for 5 to 30 hours. The mentioned aging refers to the following treatment: allowing the hot-press protection release layer to keep under a specific temperature for a specific period to fully react acrylate-based resin with the polymeric isocyanate component and reach a stable status, and then heat-drying the hot-press protection release layer to remove the solvent.

Before performing the aforementioned heat-drying procedure, the hot-press protection release colloid may be applied onto a substrate, and afterwards, the hot-press protection release colloid is subjected to the heat-drying procedure to form a hot-press protection release film with a multi-layer structure consisting of the substrate and the hot-press protection release layer. The hot-press protection release colloid may be coated on one side or two sides of the substrate to form the hot-press protection release layer on one side or two sides of the substrate.

The material of the substrate that can be used in the hot-press protection release film of the present invention is not particularly limited. Examples of the material of the substrate include but are not limited to that selected from the group consisting of metal, polyester (PET), polyethylene (PE), polyimide (PI), polyamide (PA), polyurethane (PU), triacetate cellulose (TAC), acrylics, and combinations thereof. It is preferable to select a flexible substrate, so that the hot-press protection release film prepared using the substrate can be used in the condition where the object to be hot-pressed has an uneven surface. Examples of the material of the flexible substrate include but are not limited to polyester (PET), polyethylene (PE), polyimide (PI), polyamide (PA), polyurethane (PU), and triacetate cellulose (TAC). In some embodiments of the present invention, the substrate of the hot-press protection release film is made of polyester (PET).

In some embodiments of the present invention, the surface of the hot-press protection release film that is not in contact with the substrate can be covered with a cover layer to avoid external pollution. The material of the cover layer is not particularly limited as long as the cover layer can be easily separated from the hot-press protection release film. Examples of the material of the cover layer include but are not limited to polyester (PET), polyethylene (PE), polyimide (PI), polyamide (PA), polyurethane (PU), triacetate cellulose (TAC), and the like. The use of such cover layer is not the primary feature of the present invention and can be realized by persons with ordinary skill in the art based on their ordinary skill and the disclosure of the subject application, and therefore will not be described in detail here.

Method of Manufacturing Hot-Press Protection Release Film

The present invention also provides a method of manufacturing the hot-press protection release film described above. The method comprises subjecting the hot-press protection release colloid of the present invention to a heat-drying step and afterwards to the aging step described above to form the hot-press protection release layer, wherein the hot-press protection release layer may be formed separately or may be formed on the surface of a substrate by coating the hot-press protection release colloid on the surface of the substrate and then performing the heat-drying step and the aging step.

The heating procedure, heating temperature and heating duration of the aforementioned heat-drying step are not particularly limited as long as the solvent of the hot-press protection release colloid can be mostly removed to form the hot-press protection release layer. In some embodiments of the present invention, the heat-drying step is performed by drying for 2 to 5 minutes under 180° C.

The conditions such as the material of the substrate and the temperature and duration of the aging steps are as described in the above.

Hot-Press Method

The hot-press protection release colloid and hot-press protection release film of the present invention can be applied on the surface of an object to be hot-pressed as a sacrificial hot-press protection release layer. Thus, the present invention also provides a hot-press method, which comprises the following steps in sequence:

applying the hot-press protection release colloid or the hot-press protection release film described above on the surface of an object to be hot-pressed; and hot-pressing the object to be hot-pressed under a selected temperature and pressure.

The aforementioned selected temperature and pressure depend on the hot-press conditions determined by the user, and are not particularly limited. The hot-press temperature is generally 130° C. to 280° C., such as 150° C., 160° C., 180° C., 190° C., 200° C., 220° C., 250° C., or 260° C. The hot-press pressure is generally 10 kg/cm$^2$ to 50 kg/cm$^2$, such as 20 kg/cm$^2$, 25 kg/cm$^2$, 35 kg/cm$^2$, or 40 kg/cm$^2$. The hot-press duration time may be 1 minute to 5 hours, such as 2 minutes, 3 minutes, 5 minutes, or 30 minutes. Furthermore, when the hot-press protection release film is provided with a cover layer, the cover layer is removed from the hot-press protection release film before hot-pressing.

The present invention will be further illustrated by the embodiments hereinafter, wherein the measuring instruments and methods are respectively as follows:

[Analysis of Thermal Resistance]

The hot-press protection release film is cut to A4 size and placed in an oven under 200° C. for 60 minutes. Afterwards, the appearance of the hot-press protection release film is evaluated by checking whether there is any discoloration or gelatinization. If there is no discoloration or gelatinization, the thermal resistance is recorded as "OK". If there is discoloration or gelatinization, the thermal resistance is recorded as "NG".

[Glass Transition Temperature (Tg) Test]

Glass transition temperature (Tg) is measured according to Differential Scanning calorimetry by placing the hot-press protection release film in a Differential Scanning calorimeter (DSC) (trade name: DSC 7) available from Perkin-Elmer Company. The measuring standards for Tg are IPC-TM-650.2.4.25C and 24C testing methods of the Institute for Interconnecting and Packaging Electronic Circuits (IPC).

[Analysis of Residual Colloid on Surface]

The hot-press protection release film is superimposed to a surface of an integrated circuit board (IC board) and hot-pressed under a temperature of 180° C. and a pressure of 30 kg/cm' for 5 minutes. The hot-press protection release film is then stripped from the surface of the IC board, and the surface of the IC board is observed through an optical microscope. The number of residual colloid spots is calculated by optionally picking out 5 places of unit (area: 1 square inch) from an A4 size area.

[Pulling Test]

The hot-press protection release films are respectively superimposed onto the surfaces of a copper-clad, a gum rubber material (a rubber-containing epoxy resin adhesive material), an epoxy resin, and a stainless material, and then hot-pressed under a temperature of 160° C. to 180° C. and a pressure of 30 kg/cm' for 1 to 5 minutes. Afterwards, the required pulling strength (unit: gf/in) for stripping the hot-press protection release film from the surfaces of the object is measured by a pull tension gauge.

[Performance of the Appearance of Hot-Press Protection Release Film]

The surface of the hot-press protection release film is observed by the naked eye. If the surface is confirmed to be flat, the appearance is recorded as "OK". If pits or bumps or water marks are observed on the surface, the appearance is recorded as "uneven".

[Via Holes Filling Test for Step-Difference]

Via holes with different diameters (300 μm to 1,000 μm) and different depths (25 μm to 50 μm) are arranged on the surface of a multilayer FR4 copper-clad substrate. The hot-press protection release film is superimposed onto the surface of the multilayer FR4 copper-clad substrate and then hot-pressed under a temperature of 185° C. and a pressure of 30 kg/cm$^2$ for 3 hours. Afterwards, the appearance of the surface of the hot-press protection release film is observed by the naked eye to confirm whether bubbles are generated or not. If no bubbles are generated, the via holes filling test for step-difference is recorded as "no bubble". If bubbles are generated, the via holes filling test for step-difference is recorded as "NG".

[Blocking Adhesive Test]

A groove with a height of 1.5 mm is arranged in a laminate. A copper chunk (height: 1.5 mm) is placed into the groove. An adhesive emulsion is filled into the gap between the copper chunk and the groove. Afterwards, the hot-press protection release film is superimposed onto the laminate to cover the surface of the copper chunk and the laminate and then hot-pressed under a temperature of 185° C. and a pressure of 30 kg/cm' for 3 hours. Afterwards, the appearance of the surface of the hot-press protection release film is observed by the naked eye to confirm whether the surface is flat or not. If the surface is flat, the blocking adhesive test is recorded as "flat". If the surface is uneven, the blocking adhesive test is recorded as "NG".

[Analysis of Surface Polymerization Integrity (Analysis of Gel Permeation Chromatograph (GPC))]

The surface of the hot-press protection release film is flushed with tetrahydrofuran (THF), and the used tetrahydrofuran is collected and analyzed for the polymerization degree by GPC to evaluate the surface polymerization integrity of the hot-press protection release film.

[Analysis of Surface Bumps of Hot-Press Protection Release Film after Hot-Pressing]

The hot-press protection release film is superimposed onto one surface of a copper-clad and then hot-pressed under a temperature of 180° C. and a pressure of 30 kg/cm' for 5 minutes. The hot-press protection release film is then stripped from the surface of the copper-clad, and the surface of the hot-press protection release film is observed to confirm whether bumps are generated or not. If there is no bump, the analysis of surface bumps after hot-pressing is recorded as "none". If there are bumps, the analysis of surface bumps after hot-pressing is recorded as "irregular bumps".

[Analysis of Fourier Transform Infrared Spectroscopy (FTIR)]

The hot-press protection release film is placed in a Fourier transform infrared spectrometer (trade name: Spectrum 100) available from Perkin-Elmer Company to perform FTIR analysis.

EXAMPLES

[Preparation of Hot-Press Protection Release Colloid]
<Hot-Press Protection Release Colloid 1>

A 500 ml 3-neck glass flask and a stirrer with 2 impellers are used. According to the ratio shown in Table 1, 100 g of methyl acrylate resin (available from Okahata Sangyo, ChangChun Chemical, Mitsubishi Kakoki), 10 g of polymeric isocyanate component (a mixture of polymeric isocyanate and butyl acetate) (available from ChangChun Chemical, Kasei Seiyaku), and 100 g of ethyl acetate (EAC) as a solvent were added into the flask and stirred under 40° C. under a rotation speed of 60 rpm so that each component was uniformly dissolved. After stirring for about 2 hours, a hot-press protection release colloid 1 with a viscosity of 50,000±10,000 cP was obtained.

<Hot-Press Protection Release Colloid 2>

The preparation procedures of the hot-press protection release colloid 1 were repeated to prepare a hot-press protection release colloid 2 with a viscosity of 50,000±10,000 cP, except that the amount of the polymeric isocyanate component was adjusted to 1 g as shown in Table 1.

<Hot-Press Protection Release Colloid 3>

The preparation procedures of the hot-press protection release colloid 1 were repeated to prepare a hot-press protection release colloid 3 with a viscosity of 50,000±10,000 cP, except that the amount of the polymeric isocyanate component was adjusted to 30 g as shown in Table 1.

<Hot-Press Protection Release Colloid 4>

The preparation procedures of the hot-press protection release colloid 1 were repeated to prepare a hot-press protection release colloid 4 with a viscosity of 50,000±10,000 cP, except that the platinum chelating agent and antistatic agent (available from ECHO Chemical) were further added as shown in Table 1.

<Comparative Hot-Press Protection Release Colloid 1>

The preparation procedures of the hot-press protection release colloid 1 were repeated to prepare a comparative hot-press protection release colloid 1 with a viscosity of 50,000±10,000 cP, except that the amount of the polymeric isocyanate component was adjusted to 0.1 g as shown in Table 1.

<Comparative Hot-Press Protection Release Colloid 2>

The preparation procedures of the hot-press protection release colloid 1 were repeated to prepare a comparative hot-press protection release colloid 2 with a viscosity of 50,000±10,000 cP, except that the amount of the polymeric isocyanate component was adjusted to 50 g as shown in Table 1.

TABLE 1

| | Components of hot-press protection release colloids | | | | |
| --- | --- | --- | --- | --- | --- |
| Unit: gram | Methyl acrylate resin | Polymeric isocyanate component | Solvent | Chelating agent | Antistatic agent |
| Hot-press protection colloid 1 | 100 | 10 | 100 | 0 | 0 |
| Hot-press protection colloid 2 | 100 | 1 | 100 | 0 | 0 |
| Hot-press protection colloid 3 | 100 | 30 | 100 | 0 | 0 |

TABLE 1-continued

Components of hot-press protection release colloids

| Unit: gram | Methyl acrylate resin | Polymeric isocyanate component | Solvent | Chelating agent | Antistatic agent |
|---|---|---|---|---|---|
| Hot-press protection colloid 4 | 100 | 10 | 100 | 5 | 1 |
| Comparative hot-press protection colloid 1 | 100 | 0.1 | 100 | 0 | 0 |
| Comparative hot-press protection colloid 2 | 100 | 50 | 100 | 0 | 0 |

Example 1: Preparation of Hot-Press Protection Release Film

The hot-press protection release colloids 1 to 4 and the comparative hot-press protection release colloids 1 and 2 were used to prepare hot-press protection release films 1 to 4 and comparative hot-press protection release films 1 and 2, respectively. First, the hot-press protection release colloids 1 to 4 and the comparative hot-press protection release colloids 1 and 2 were respectively coated onto PET substrates by using a die coater under room temperature, and then heated and dried under 180° C. for 2 to 5 minutes to form hot-press protection release layers on the PET substrates. Next, the following aging steps were performed to prepare hot-press protection release films 1 to 4 and comparative hot-press protection release films 1 and 2: the PET substrates with hot-press protection release layers formed thereon stayed in room temperature for 7 days, and then were heated and dried under 100° C. for about 15 hours.

Then, the hot-press protection release colloid 1 was used to prepare hot-press protection release film 5 and comparative hot-press protection release film 3 by repeating the preparation procedures of the hot-press protection release film 1 except that in the preparation procedures of comparative hot-press protection release film 3, the aging steps were omitted, and in the preparation procedures of hot-press protection release film 5, the following aging steps were performed: the PET substrate with a hot-press protection release layer formed thereon stayed at 50° C. for 6 hours, and then was heated and dried under 80° C. to 150° C. for about 15 hours.

The analysis of thermal resistance, Tg test, analysis of residual colloid on surface, pulling test, performance of appearance, via holes filling test for step-difference, blocking adhesive test, analysis of surface polymerization integrity, and analysis of surface bumps of hot-press protection release film after hot-pressing were performed for the hot-press protection release films 1 to 5 and the comparative hot-press protection release films 1 to 3. The results are tabulated in Table 2. In addition, the FTIR analysis was performed for the hot-press protection release film 4. The result is shown in FIGURE.

TABLE 2

Properties of hot-press protection release films

| | | Hot-press protection release film | | | | | Comparative hot-press protection release film | | |
|---|---|---|---|---|---|---|---|---|---|
| | Unit | 1 | 2 | 3 | 4 | 5 | 1 | 2 | 3 |
| Thermal resistance | | OK | OK | OK | OK | OK | OK | OK | OK |
| Tg | ° C. | 132 | 128 | 134 | 136 | 131 | 121 | 138 | 128 |
| Residual colloid | number | 1 | 2 | 1 | 0 | 1 | 30 | 3 | 25 |
| Pulling test Stainless | gf/m | 25 | 28 | 24 | 22 | 35 | 63 | 23 | 45 |
| Copper clad | | 20 | 23 | 16 | 17 | 28 | 37 | 15 | 31 |
| Gum rubber | | 10 | 12 | 9 | 11 | 18 | 29 | 8 | 26 |
| Epoxy resin | | 30 | 33 | 28 | 28 | 40 | 57 | 29 | 43 |
| Appearance | | OK | OK | OK | OK | OK | OK | uneven | OK |
| Via holes filling test for step-difference | | No bubble | No bubble | No bubble | No bubble | No bubble | No bubble | NG | No bubble |
| Blocking adhesive test | | flat | flat | flat | flat | flat | flat | NG | flat |
| GPC analysis | | <1000 | 5000 | <1000 | <1000 | <1000 | >10000 | <1000 | >100000 |
| Surface bumps | | None | None | None | None | None | None | irregular bumps | None |

As shown in Table 2, by virtue of the specific constitution of the hot-press protection release colloid and the specific aging steps, the hot-press protection release films 1 to 5 prepared by using the hot-press protection release colloids 1 to 5 of the present invention have the following outstanding physicochemical properties. Each of the hot-press protection release films 1 to 5 has a thermal resistance reaching 200° C. and therefore is suitable for the application in the hot-press process. There are only a few residual colloid spots or substantially no residual colloid spots on the surface of the hot-pressed object after the hot-press protection release films 1 to 5 are stripped from the hot-pressed object. The pulling strength for any one of stripping the hot-press protection release films 1 to 5 from the hot-pressed object is far below 50 gf/in, and thus, the release of those films is easy. The appearance of the surface of each of the hot-press protection release films 1 to 5 is flat without pits or bumps and has no water marks after the hot-press protection release films 1 to 5 were placed onto the surface of an object to be hot-pressed and subjected to the hot-press process. The via holes filling test for step-difference and blocking adhesive test performance of the hot-press protection release films 1 to 5 are excellent, which means the adhesive overflow can be avoided and the hot-pressed surface can be kept flat during the hot-press process. According to the result of the GPC analysis, the polymerization degree of each of the hot-press protection release colloids 1 to 5 of the present invention is almost complete because the molecular weight of the small molecular polymer washed out from the surface of the prepared hot-press protection release film by solvent in each case is lower than 10,000. The complete polymerization make it possible to release the hot-press protection release film without leaving any residue. Further, the hot-press protection release films 1 to 5 have no bumps generated on their surface after the hot-press process.

Furthermore, as illustrated in the hot-press protection release colloid 4, the addition of additives such as chelating agent and antistatic agent can further improve the Tg of the hot-press protection release film without adversely affecting the aforementioned excellent properties. It is believed that the additives further improve the polymerization degree of the hot-press protection release colloid.

Compared to the present invention, the comparative hot-press protection release film 1 fails to reach ideal polymerization because the amount of polymeric isocyanate component in the comparative hot-press protection release colloid 1 is too low (i.e., lower than designated amount of the present invention). As a result, the GPC test of the comparative hot-press protection release film 1 is poor and the molecular weight of the small molecular polymer washed out from the surface of the comparative hot-press protection release film 1 by the solvent is higher than 10,000. Furthermore, the release performance of the comparative hot-press protection release film 1 is poor because the pulling strength required for stripping the comparative hot-press protection release film 1 from the hot-pressed object is high and in some cases, even higher than 50 gf/in, and many residual colloid spots remain on the surface of the hot-pressed object after stripping. There are bumps generated on the surface of the prepared comparative hot-press protection release film 2 because the amount of polymeric isocyanate component in the comparative hot-press protection release colloid 2 is too high (i.e., higher than the designated amount of the present invention). In addition, the hot-pressed surface of the comparative protection release film 2 is uneven after the hot-press processes, and as a result, the via-hole filling for step-difference and stopping-adhesive performance of the comparative protection release film 2 is poor. The comparative hot-press protection release film 3 has incomplete polymerization due to the omission of aging steps. The GPC test result of the comparative hot-press protection release film 3 is poor, and the molecular weight of the small molecular polymer washed out from the surface of the comparative hot-press protection release film 3 by solvent is higher than 100,000. The release performance of the comparative hot-press protection release film 3 is poor too because the pulling strength required for stripping the comparative hot-press protection release film 3 from the hot-pressed object after hot-press processes is high and in some cases even close to 50 gf/in. Many residual colloid spots remain on the surface of the hot-pressed object after stripping.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A hot-press protection release film for applying on a surface of an object to be hot-pressed, wherein the hot-press protection release film comprises a hot-press protection release layer, and the hot-press protection release layer is formed by subjecting a hot-press protection release colloid to a heat-drying step and afterwards to the following aging steps: allowing the hot-press protection release colloid to stand under room temperature for 5 to 9 days or drying the hot-press protection release colloid under 40° C. to 60° C. for 4 to 8 hours, and then drying the hot-press protection release colloid under 80° C. to 150° C. for 5 to 30 hours, wherein the hot-press protection release colloid has a viscosity of 10,000 to 500,000 cP at 40° C. and comprises an acrylate-based resin, a polymeric isocyanate component, and a solvent, and the amount of the polymeric isocyanate component is 1 to 30 parts by weight per 100 parts by weight of the acrylate-based resin.

2. The hot-press protection release film of claim 1, wherein the hot press protection release film further comprises a substrate and the hot-press protection release layer is formed on one surface of the substrate, and wherein the substrate is made of material selected from the group consisting of metal, polyester (PET), polyethylene (PE), polyimide (PI), polyamide (PA), polyurethane (PU), triacetate cellulose (TAC), acrylics, and combinations thereof.

3. A hot-press method, comprising the following steps in sequence:
    applying the hot-press protection release film of claim 1 on a surface of an object to be hot-pressed; and
    hot-pressing the object to be hot-pressed under a selected temperature and pressure.

4. A hot-press method, comprising the following steps in sequence:
    applying a hot-press protection release colloid on a surface of an object to be hot-pressed, wherein the hot-press protection release colloid has a viscosity of 10,000 to 500,000 cP at 40° C. and comprises an acrylate-based resin, a polymeric isocyanate component, and a solvent, and the amount of the polymeric isocyanate component is 1 to 30 parts by weight per 100 parts by weight of the acrylate-based resin; and
    hot-pressing the object to be hot-pressed under a selected temperature and pressure.

5. A method of manufacturing a hot-press protection release film, wherein the hot-press protection release film comprises a hot-press protection release layer, the method comprises:
    subjecting a hot-press protection release colloid to a heat-drying step and afterwards to the following aging step to form the hot-press protection release layer:
    allowing the hot-press protection release colloid to stand under room temperature for 5 to 9 days or drying the hot-press protection release colloid under 40° C. to 60° C. for 4 to 8 hours, and then drying the hot-press protection release colloid under 80° C. to 150° C. for 5 to 30 hours, wherein the hot-press protection release colloid has a viscosity of 10,000 to 500,000 cP at 40° C. and comprises an acrylate-based resin, a polymeric isocyanate component, and a solvent, and the amount of the polymeric isocyanate component is 1 to 30 parts by weight per 100 parts by weight of the acrylate-based resin.

6. The method of claim 5, wherein the hot-press protection release film further comprises a substrate, and the method further comprises applying the hot-press protection release colloid on a surface of the substrate before subjecting the hot-press protection release colloid to the heat-drying step, so that the hot-press protection release layer is formed on the surface of the substrate after the heating drying procedure, and wherein the substrate is made of material selected from the group consisting of metal, polyester, polyethylene, polyimide, polyamide, polyurethane, triacetate cellulose, acrylics, and combinations thereof.

* * * * *